(12) United States Patent
Oh

(10) Patent No.: US 7,027,344 B1
(45) Date of Patent: Apr. 11, 2006

(54) HIGH-SPEED SEMICONDUCTOR MEMORY HAVING INTERNAL REFRESH CONTROL

(75) Inventor: Jong-Hoon Oh, Chapel Hill, NC (US)

(73) Assignee: G-Link Technology, Hsin Chu (TW)

( * ) Notice: Subject to any disclaimer, the term of this patent is extended or adjusted under 35 U.S.C. 154(b) by 131 days.

(21) Appl. No.: 10/804,461

(22) Filed: Mar. 18, 2004

(51) Int. Cl.
*G11C 7/00* (2006.01)

(52) U.S. Cl. ............... 365/222; 365/189.07; 365/236; 365/189.02; 365/189.12

(58) Field of Classification Search ............... 365/222, 365/189.07, 236, 189.02, 189.12
See application file for complete search history.

(56) References Cited

U.S. PATENT DOCUMENTS 6,614,698 B1 * 9/2003 Ryan et al. ............ 365/189.04

2003/0169634 A1 * 9/2003 Kilmer et al. ............ 365/222

\* cited by examiner

*Primary Examiner*—Tuan T. Nguyen
(74) *Attorney, Agent, or Firm*—Townsend and Townsend and Crew LLP

(57) ABSTRACT

The refresh address generator of a memory includes, in part, a counter, a multitude of shift registers and multiplexers, and a comparator. With each clock cycle, the counter increments and stores the refresh count address, and the addresses stored in the counter and the shift registers prior to the increment operation is shifted out and stored in a pipelined fashion. If the array address stored in the last stage of the register pipeline is equal to the address of the array read out during the cycle immediately preceding the refresh cycle or is equal to the address of the neighboring array of the read out array, the comparator causes multiplexer to select the address stored in the counter as the refresh address. This address differs from the address of the array read out during the immediately preceding cycle by at least two counts.

14 Claims, 4 Drawing Sheets

HIGH-SPEED SEMICONDUCTOR MEMORY HAVING INTERNAL REFRESH CONTROL

FIELD OF THE INVENTION

The present invention relates to integrated circuits, and more particularly to integrated circuit memories.

BACKGROUND OF THE INVENTION

Two types of well-known volatile semiconductor memories are dynamic random access memory (DRAM) and static random access memory (SRAM). A few of many differences between these memories are: (1) the DRAM cell is much smaller than the SRAM cell (e.g., by a factor of about 4 to 6 for the same technology), (2) a read operation in a DRAM is destructive (i.e., the cell data is lost), while a read operation in a SRAM is non-destructive, (3) due to leakage in DRAM cells, DRAMs require periodic refresh operations to maintain the stored data, while no refresh operation in required in SRAMs, and (4) read and write operations in a SRAM are faster than in a DRAM.

Because of the large SRAM cell size, the increase in SRAM density has been limited. Currently SRAMs with a storage capacity of greater than 16 Mb are being manufactured using 0.13 um technology. In contrast, because of the small size of the DRAM cell, the DRAM density has increased significantly with advancing technology. Currently DRAM having a storage capacity of 256 Mb or greater are being manufactured in 0.13 um technology.

In recent years, attempts have been made to eliminate the barrier to achieving high density SRAMs by using the DRAM cell in an SRAM device. To integrate the DRAM cell into an SRAM device, the refresh requirement of the DRAM cells needs to be properly addressed. In DRAM devices, a specific command is dedicated for refresh operations. Some SRAM vendors have changed the SRAM pin out to include a device pin for the refresh operations to enable integration of the DRAM cell into the SRAM device. However, because of the added refresh pin, these SRAM devices deviate from industry standard SRAM pin-outs, and thus can not be used as SRAM drop-in replacements.

Therefore, to be fully compatible with the SRAM industry standards, the refresh operation needs to be externally made transparent, i.e., be performed internally without any external control. Some SRAM vendors have produced such SRAM devices, however, these SRAM devices are slower than their conventional SRAM counterparts. The slow down is primarily due to the required refresh operations as described next with reference to FIGS. 1 and 2.

FIG. 1 shows a conventional shared bitline sense amplifier (BL_S/A) DRAM array architecture used in a SRAM device. Eight array sections Array_0 through Array_7 with a row of BL_S/A blocks between every two adjacent array sections is shown. Each BL_S/A block receives one pair of complimentary bitlines BL, $\overline{BL}$ from the array section directly above it (i.e., "upper array") and another pair of bitlines BL, $\overline{BL}$ from the array section directly below it (i.e., the "lower block"), hence "the shared bitline sense amplifier array architecture". This array architecture relaxes the BL_S/A pitch by a factor of 2 while reducing the die size since each BL_S/A block is shared by two pairs of bitlines. Thus, if each array section has 1024 pairs of BL, $\overline{BL}$, 512 BL_S/A blocks are needed between every two array sections.

Because of the shared BL_S/A configuration, in a read operation wherein a wordline is selected in one of the eight array sections, two rows of BL_S/A blocks directly above and below the array section with the selected wordline are activated. Upon completion of sensing, the two activated rows of BL_S/A are automatically precharged in preparation for the next operation.

A refresh operation is similar to a read operation, and is controlled by an on chip refresh address generator. Thus, a refresh cycle takes the same amount of time as a normal read cycle. Conventionally, refresh operations are embedded in between read operations. This results in a read access penalty as shown in FIG. 2.

FIG. 2A is a timing diagram showing two consecutive read cycles with a hidden refresh cycle in between. This timing diagram shows the worst case scenario wherein the selected wordline in each of the refresh cycle, the read cycle preceding the refresh cycles, and the read cycle succeeding the refresh cycle is within the same array section or within neighboring array sections.

As shown in FIG. 2A, a first read cycle corresponding to address $A_m$ is followed by a second read cycle corresponding to address $A_n$. In the first read cycle, wordline $WL_m$ is selected and automatically deselected upon completion of the sensing operation. This duration is indicated as $t_{WL}$. Upon deselection of $WL_m$, an automatic precharge operation occurs to precharge the two rows of activated BL_S/A blocks adjacent the array section in which the selected $WL_m$ is located. This precharge period is indicated as $t_{PC}$. As shown, the wordline $WL_{refresh}$ selected by the refresh address generator (not shown) cannot go high until precharge $t_{PC}$ is completed. This is because $WL_{refresh}$ and $WL_m$ are within the same or neighboring array section, thus requiring the corresponding BL_S/A blocks to be fully precharged before wordline selection occurs.

Similar to the $A_m$ read cycle, the refresh cycle includes a wordline selection and sensing operation followed by a precharge operation $t_{PC}$. The timing of the $A_n$ read cycle is limited by the time at which precharge operation $t_{PC}$ ends. That is, $WL_n$ cannot go high until $t_{PC}$ is complete because, as indicated above, $WL_{refresh}$ and $WL_n$ are within the same or neighboring arrays. Thus, it can be seen that a worst case read cycle $t_{RC}$ must accommodate two $t_{WL}$ periods and two $t_{PC}$ periods, as shown by the expression below:

$$t_{RC}(\text{worst case})=2\times(t_{WL}+t_{PC}) \quad (1)$$

The delay attributed to the refresh cycle would not cause a read access slow down if the $WL_{fresh}$ is in an array other than the same array or neighboring arrays of the array within which the selected $WL_n$ and $WL_m$ are located. However, because SRAMs are randomly accessed, the worst case speed path ($t_{RC}$) constitutes the speed of the device.

FIG. 2B shows, in part, the timing relationship between the signals activating the sense amplifiers and the signal initiating a refresh cycle, as known in the prior art. Signals ras_act and SA_start respectively cause the array address and associated sense amplifiers to be activated. As seen from FIG. 2B, the time delay $t_{PC}$ is required to elapse between the initiation of signal refresh and the signal SA_done which represents the completion of the sensing operation. The read cycle $t_{RC}$ covers the time period between the assertion of signal ras_act and signal refresh.

Another issue that must be addressed if read cycles times similar to conventional SRAM devices are to be achieved, is the occurrence of invalid addresses. In conventional DRAM devices, invalid addresses do not cause a slow down in the memory operation because of the presence of the external clock. In conventional SRAMs, an invalid address does not cause a slow down because of the static nature of the memory. However, in SRAM devices with DRAM cells, invalid addresses can cause slow down in memory operation. In the absence of an external clock, any address change (valid or invalid) will propagate through the memory. Thus, if an invalid address occurs, and shortly thereafter a valid address occurs, the memory operation corresponding to the valid address needs to be delayed until the operation corresponding to the invalid address is completed.

Thus, a DRAM-based SRAM device fully compatible with standard SRAM pin-out, and device access time similar to high-speed SRAMs is desirable.

BRIEF SUMMARY OF THE INVENTION

In accordance with the present invention, the memory array to be refreshed in a refresh cycle is other than the array selected in the read cycle immediately preceding the refresh cycle or a neighboring array of this selected array. In some embodiments, the refresh address generator generating the refresh array address includes, in part, a counter, a multitude of shift registers and multiplexers, and a comparator.

With each clock cycle, the counter increments and stores the refresh count address. Furthermore, with each clock cycle the address stored in the counter prior to the increment is shifted out and stored in the shift registers in a pipeline fashion, i.e., the counter's count prior to the increment is stored in the first stage of the shift register pipeline, the address stored in the first stage of the shift register pipeline prior to the increment is shifted out and stored in the second stage of the shift register pipeline, etc. The comparator compares the array address stored in the last stage of the shift register pipeline to the array address selected in the read cycle immediately preceding the refresh cycle. If these two addresses are the same, or if the address stored in the last stage of the shift register pipeline is equal to the array address of the neighboring array of the array selected in the read cycle immediately preceding the refresh cycle, the comparator asserts a shuffle signal. If the shuffle signal is asserted, the address stored in the counter is selected as the address of the array to be refreshed by the multiplexers. This selected address differs from the address of the array read out during the immediately preceding cycle by at least two counts.

In some embodiments, the memory is a DRAM-based SRAM device with standard SRAM pin-out, in which a multitude of sense amplifiers are shared by each pair of neighboring arrays.

DETAILED DESCRIPTION OF THE INVENTION

In accordance with the present invention, a refresh technique which does not require any external control and which results in improved device access time is used in a DRAM-based SRAM device. Further, the refresh technique also minimizes the slow-down in $t_{RC}$ due to invalid address accesses. In one embodiment, during a refresh cycle, a refresh address generator selects an array other than the array selected in the read cycle immediately preceding the refresh cycle or a neighboring array of this selected array.

Figure 1:
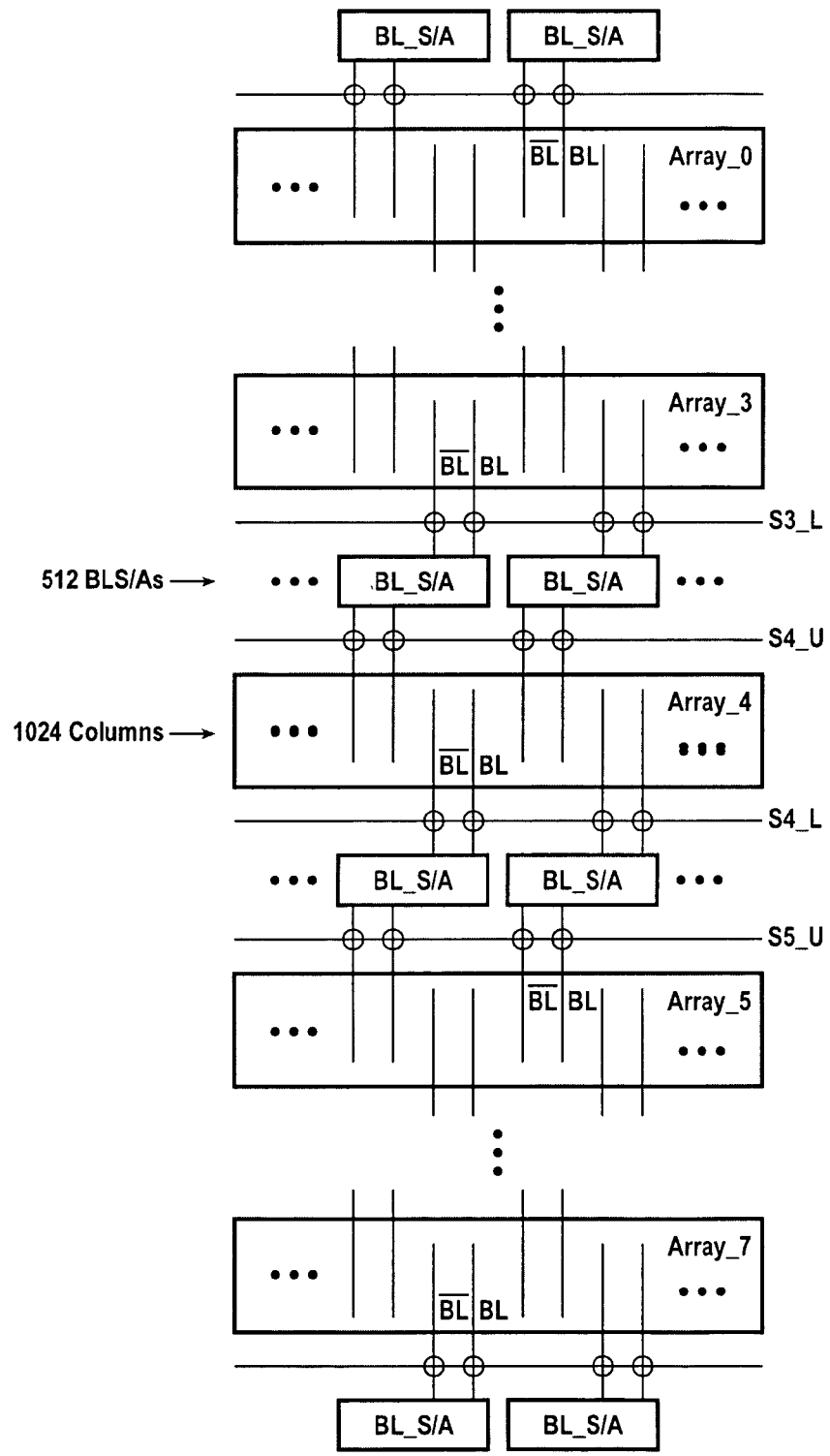
FIG. 1 shows a conventional shared bitline sense amplifier DRAM array architecture used in a SRAM device, as known in the prior art.

As shown in FIG. 1, the eight arrays are sequentially designated from top to bottom as Array_0_1_2_3_4_5_6_7. Conventional refresh address generator are designed to count in the sequence of, for example, Array_0_2_4_6_1_3_5_7, or Array_0_3_4_7_1_2_5_6. In order to avoid selecting the same or a neighboring array of the array selected in the preceding read cycle, a comparator compares the previous array address with the current refresh array address, and if the previous array address is the same as or +/−1 array address of the current refresh array address (i.e., a neighboring array), then the refresh address generator shuffles its output two cycles forward. As an example, if the current output of the refresh address generator indicates Array_2, and the previous array address was any one of Array_1 Array_2 or Array_3, then the refresh address generator shuffles its output two cycles forward from Array_2 to Array_6 (see the array sequences shown above).

Figure 3:
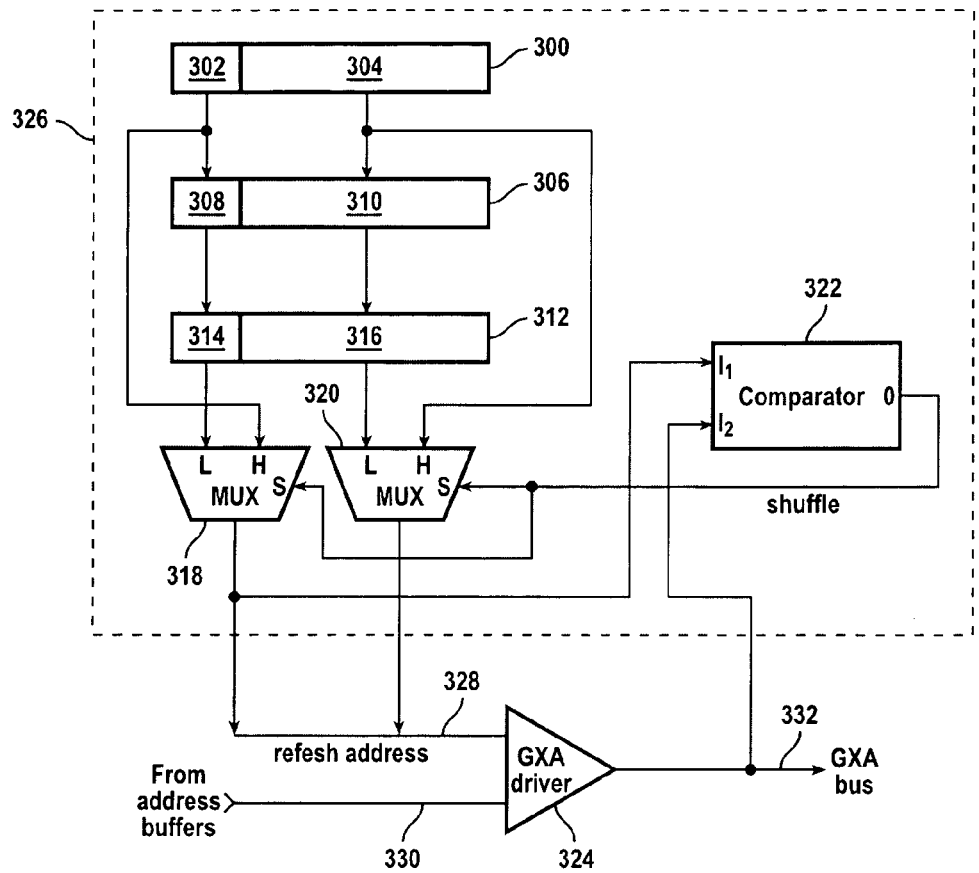
FIG. 3 is a simplified high-level block diagram of a circuit adapted to shuffle the refresh address in accordance with one embodiment of the present invention.

A circuit for implementing the above technique is shown in FIG. 3. In describing FIG. 3, it is assumed that the memory is partitioned into eight arrays, each of which is adapted to include a number of rows and columns. It is understood, however, that in other embodiments, the memory may be partitioned into more or fewer than eight arrays with a corresponding change in the exemplary refresh address shuffling circuit shown in FIG. 3.

Refresh address counter 300 includes a three bit field 302 in its three least significant bit positions that point to one of the eight array addresses. The remaining bits stored in field 304 of counter 300 point to an array different than that pointed to by bits 302. During each cycle, the address stored in fields 302 and 304 of register 300 is incremented; the data previously stored in fields 302, and 304 is shifted and loaded, respectively, in fields 308 and 310 of register 306, and the data previously loaded into bits 308, and 310 of register 306 is shifted and loaded, respectively, in fields 314 and 316 of register 312.

Data stored in field 302 of register 300 is supplied to input terminal H of multiplexer 318, and data stored in field 304 of register 300 is supplied to input terminal H of multiplexer 320. Data stored in field 314 of register 314 is supplied to input terminal L of multiplexer 318, and data stored in field 316 of register 312 is supplied to input terminal L of multiplexer 320. The select terminal S of multiplexers 318 and 320 receives signal Shuffle generated at output terminal O of comparator 322.

The output of multiplexers 318, 320 are coupled to one input 328 of a global x-address (GXA) bus driver 324. GXA driver 324 receives addresses from address buffers at its second input 330, and provides either the refresh address from an on-chip counter or the address from the address buffers on the GXA bus 332 at its output. The GXA bus 332 is coupled to the arrays and row decoders (not shown). Comparator 322 has one input coupled to receive the output of multiplexer 318, and a second input coupled to receive the GXA bus. The output signal Shuffle of comparator 322 is applied to the select input terminals S of multiplexers 318, 320. If the address present at the output terminals of multiplexer 318 matches the address present on GXA bus 322, or if the address present at the output terminals of multiplexer 318 differs from the address present on GXA bus 322 driver by +/−1, signal Shuffle is asserted. If signal Shuffle is asserted, multiplexers 318 and 320 respectively pass the addresses stored in register 300 to their output terminals.

Figure 4:
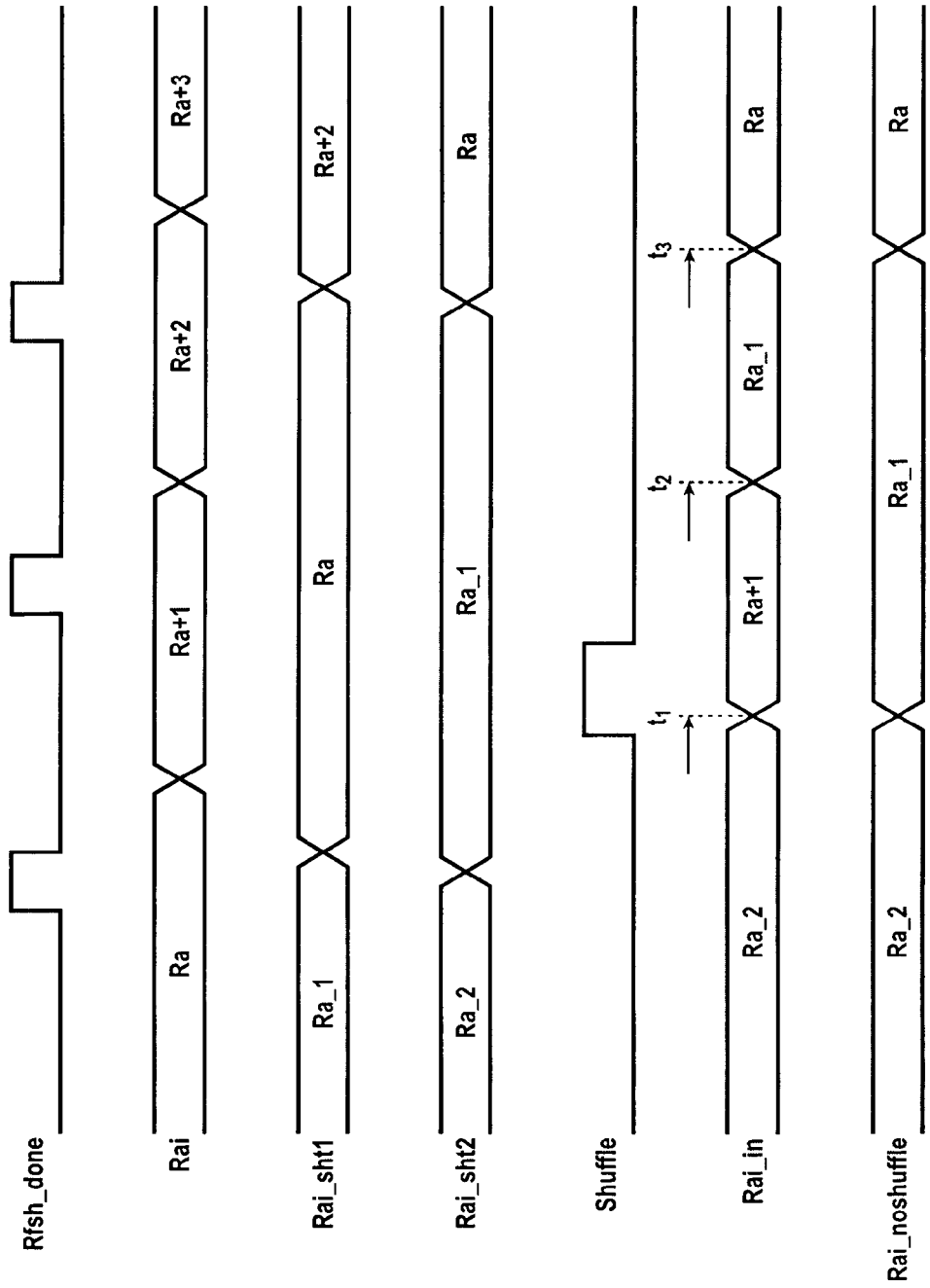
FIG. 4 is a timing diagram of signals corresponding to refresh address shuffling operation as performed by the circuit of FIG. 3.

FIG. 4 is a timing diagram of some of the signals associated with the refresh address shuffling operation as performed by the circuit of FIG. 3, and in accordance with one exemplary embodiment of the present invention. With each rising transition of signal Rfrsh_done, the array refresh address pointed to by signal Rai and stored in counter 300 is incremented; these array refresh addresses are shown as Ra, Ra+1, and Ra+2. In response to the first shown transition of signal Rfrsh_done, address Ra is shifted and loaded in register 306 via signal Rai_sht1, and address Ra−1 is shifted and loaded in register 312 via signal Rai_sht2. Signal Rai_in is the refresh address that is supplied at the output terminal of multiplexer 318.

Assume that prior to time $T_1$, the address present on GAX bus 332 matches or differs by +/−1 from the address present at the output terminal of multiplexer 318. Therefore, signal Shuffle generated by comparator 322 is asserted, as shown in FIG. 4. This causes the address data carried by signal Rai, i.e. Ra+1, and stored in field 302 of register 330 to pass to multiplexer 318's output terminal, thereby causing signal Rai_in to change from Ra−2 to Ra+1. Assume further that after time $T_1$ and prior to time $T_2$ the address on GAX bus 332 changes to a value different from Ra+1. This causes signal Shuffle to be deasserted. Therefore, terminal S of multiplexer 318 causes the address data carried by signal Ra_sht2, i.e., Ra−1, and stored in field 314 of register 312 to pass to the output terminal of multiplexer 318's, thereby causing signal Rai_in to change from Ra+1 to Ra−1, as shown in FIG. 4. At time $T_3$ the data carried by signal Rai_in changes to Ra in response to the same change in signal Rai_sht2. In the absence of the shuffling circuit of the present invention, the data carried by signal Rai_in would not change at time $T_2$; this is shown by signal Rai_noshuffle. In other words, signal Rai_noshuffle shows the values that would be carried by signal Rai_in if no shuffling circuit were used.

Figure 2A:
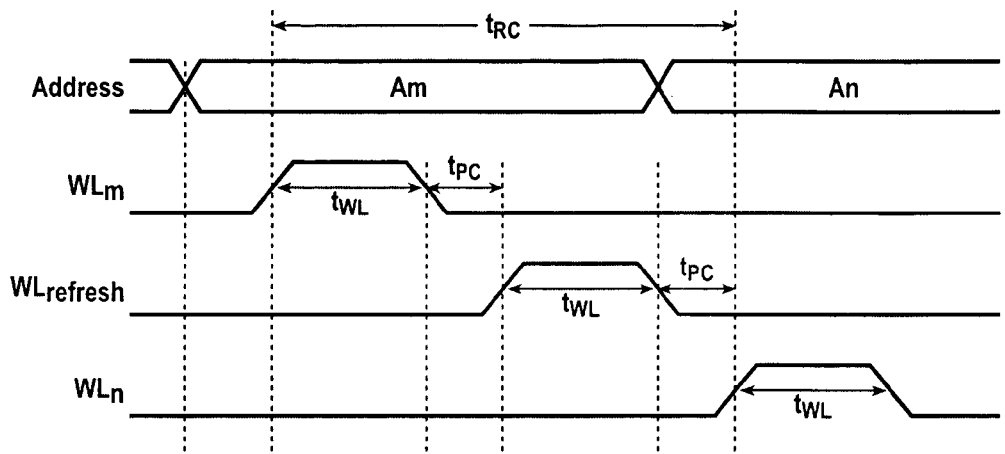
FIG. 2A is a timing diagram of two consecutive read cycles with a hidden refresh cycle in between, as known in the prior art.
Figure 2B:
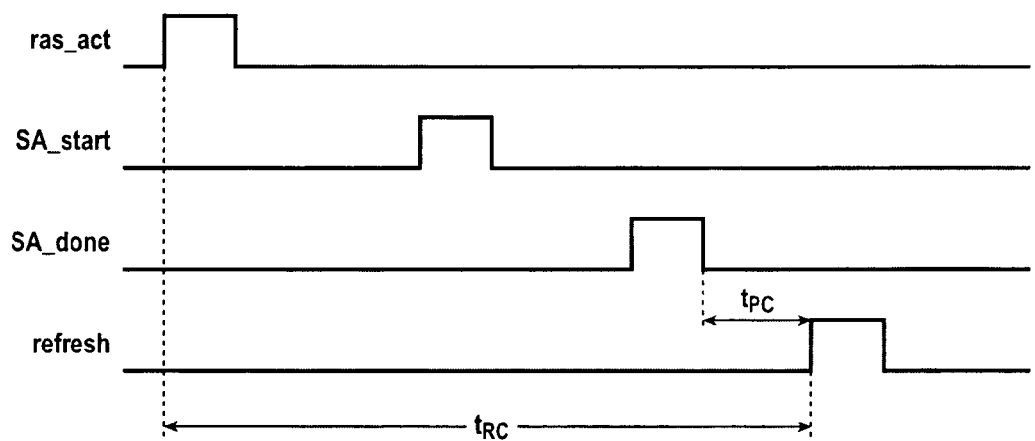
FIG. 2B shows, in part, the timing relationship between the signals activating the sense amplifiers and the signal initiating a refresh cycle, as known in the prior art.
Figure 5:
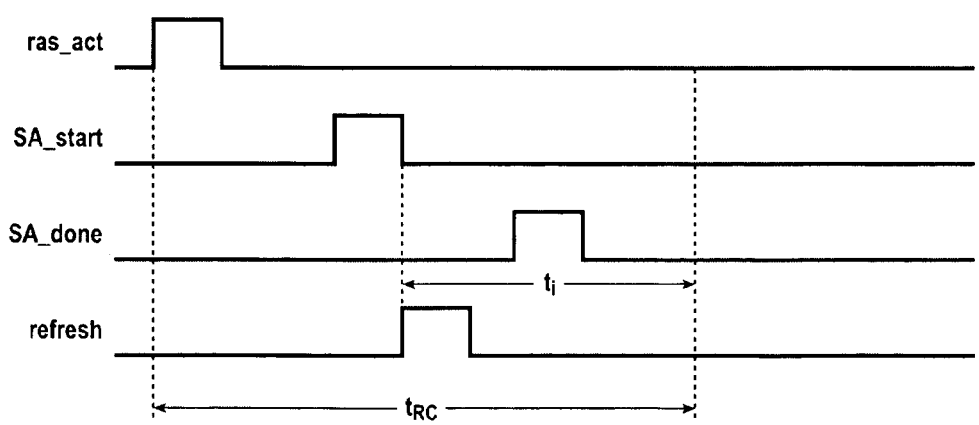
FIG. 5 shows, in part, the timing relationship between the signals activating the sense amplifiers and the signal initiating a refresh cycle, in accordance with an exemplary embodiment of the present invention.

FIG. 5 shows, in part, the timing relationship between the signals activating the sense amplifiers and the signal initiating a refresh cycle, in accordance with the present invention. Signals ras_act and SA_start respectively cause the row address and associated sense amplifiers to be activated. As seen from FIG. 5, signal refresh may be asserted before the sensing operation is completed. In other words, signal refresh may be asserted before signal SA_done is asserted. This is in contrast to the prior art timing diagram shown in FIG. 2B, in which the refresh cycle has to wait for a time period of $t_{pc}$ after signal SA_done is deasserted. Therefore, the present invention achieves timing improvement of $T_i$ for each read cycle time period of $t_{RC}$.

The above embodiments of the present invention are illustrative and not limitative. The invention is not limited by the number of arrays disposed in the memory, nor is it limited by the number of rows or columns disposed in each array. The invention is not limited by the type of shift register, comparator, or multiplexer disposed in the refresh address shuffling circuit of the present invention. Other additions, subtractions or modification are obvious in view of the present invention and are intended to fall within the scope of the appended claims.

What is claimed is:

1. A memory comprising:
a counter configured to increment and store an address data pointing to a first array address with each transition of a clock signal;
a comparator configured to compare the first array address with a second array address read out during a first cycle, said comparator further configured to assert a first signal if the first array address matches the second array address or if the first array address matches an address of a neighboring array of the second array address; and
a first circuit configured to generate a refresh array address during a second cycle immediately succeeding the first cycle, wherein the first circuit generates a refresh array address that is different from the second array address or the address of the neighboring array of the second array address.

2. The memory of claim 1 further comprising:
a pipelined shift register having at least two pipeline stages, wherein with each transition of the clock signal, the data stored in the counter prior to the increment is shifted and loaded into the first stage of the pipeline, and a previous data stored in the first stage of the pipeline is shifted and loaded into the second stage of the pipeline.

3. The memory of claim 2 further comprising:
a multiplexer configured to receive the data stored in the counter and the second stage of the pipeline at its respective first and second input terminals.

4. The memory of claim 3 wherein said multiplexer receives the first signal generated by the comparator at its select input terminal.

5. The memory of claim 4 wherein the memory is a DRAM-based SRAM.

6. The memory of claim 5 further comprising:
a plurality of sense amplifiers that are shared by each pair of neighboring arrays.

7. The memory of claim 5 wherein each array includes a plurality of memory cells disposed along rows and columns of that array.

8. A method for operating a memory device comprising:
selecting a first array to perform a read operation during a first operation cycle; and
selecting a second array to perform a refresh operation during a second operation cycle immediately succeeding the first operation cycle, wherein the second array is different from both the first array and a neighboring of the first array.

9. The method of claim 8 further comprising:
comparing an address of the first array with a third array address; and
asserting a signal if the third array address matches the first array address or an address of its neighboring array.

10. The method of claim 9 further comprising:
setting an address of the second array equal to the third array address if the signal is not asserted.

11. The method of claim 10 further comprising:
storing each of the first, second and third array addresses.

12. The method of claim 11 further comprising:
incrementing the second array address; and
shifting the said second array address before it is incremented.

13. The method of claim 12 wherein the first and second array addresses differ by a count of two addresses.

14. The method of claim 13 wherein the memory is a DRAM-based SRAM memory.

* * * * *